(12) United States Patent
Shrivastava (10) Patent No.: US 6,903,434 B2
(45) Date of Patent: Jun. 7, 2005

(54) METHOD AND APPARATUS FOR INTEGRATING FLASH EPROM AND SRAM CELLS ON A COMMON SUBSTRATE

(75) Inventor: Ritu Shrivastava, Fremont, CA (US)

(73) Assignee: Alliance Semiconductors, Santa Clara, CA (US)

( * ) Notice: Subject to any disclaimer, the term of this patent is extended or adjusted under 35 U.S.C. 154(b) by 0 days.

(21) Appl. No.: 09/315,599

(22) Filed: May 20, 1999

(65) Prior Publication Data

US 2002/0089029 A1 Jul. 11, 2002

(51) Int. Cl.$^7$ ................................................ H01L 29/00
(52) U.S. Cl. .................. 257/499; 257/501; 257/502; 257/511
(58) Field of Search ................. 257/499–510, 257/382

(56) References Cited

U.S. PATENT DOCUMENTS

| | | | | |
|---|---|---|---|---|
| 4,658,283 A | * | 4/1987 | Koyama | 357/41 |
| 5,169,792 A | * | 12/1992 | Katoh | 257/398 |
| 5,200,636 A | * | 4/1993 | Uemura | 257/315 |
| 5,559,348 A | * | 9/1996 | Watabe | 257/141 |
| 5,605,853 A | * | 2/1997 | Yoo | 437/43 |
| 5,679,599 A | * | 10/1997 | Mehta | 437/69 |
| 5,702,988 A | * | 12/1997 | Liang | 438/238 |
| 5,723,895 A | * | 3/1998 | Takahashi | 257/499 |
| 5,833,745 A | * | 11/1998 | Atsuki | 427/226 |
| 5,898,619 A | * | 4/1999 | Chang | 365/149 |
| 6,051,868 A | * | 4/2000 | Watanabe | 257/503 |
| 6,060,348 A | * | 5/2000 | Yang | 438/227 |
| 6,124,882 A | * | 9/2000 | Voois | 348/15 |
| 6,128,240 A | * | 10/2000 | Cutter | 365/200 |
| 6,133,640 A | * | 10/2000 | Leedy | 257/778 |
| 6,136,652 A | * | 10/2000 | Hazani | 438/260 |
| 6,141,242 A | * | 10/2000 | Hsu | 365/182 |
| 6,141,706 A | * | 10/2000 | Thornton | 710/21 |
| 6,141,739 A | * | 10/2000 | Provence | 711/211 |
| 6,153,476 A | * | 11/2000 | Inaba | 438/275 |

* cited by examiner

Primary Examiner—Hoai Pham
Assistant Examiner—Nathan W. Ha
(74) Attorney, Agent, or Firm—Haverstock & Owens LLP (57) ABSTRACT

A system for and a method of integrating SRAM cells and flash EPROM cells onto a single silicon substrate includes an area on the silicon substrate where a local oxidation of silicon (LOCOS) isolation technique is implemented and another area on the same silicon substrate where a shallow trench isolation (STI) technique is implemented. Further, this system and method also include flash EPROM cells implemented within the area of the substrate utilizing the LOCOS isolation technique and SRAM cells implemented within the area of the substrate utilizing the STI technique. Preferably, the LOCOS isolation technique is first implemented to define a flash area of the silicon substrate on which the flash EPROM cell is implemented. Before the LOCOS isolation technique is implemented, an SRAM area is masked. After the LOCOS isolation technique has been fully implemented, the flash area is then preferably masked and the STI technique is implemented in order to define the SRAM area of the silicon substrate on which the SRAM cell is implemented. After the STI technique is implemented, the flash EPROM and the SRAM cells are preferably formed. Thus, the SRAM cells and the flash EPROM cells are both implemented on the common silicon substrate, but yet are appropriately isolated from each other, as well as from other additional devices which may be further implemented on the same silicon substrate, while providing the advantages of respective isolation schemes for the two cells.

15 Claims, 12 Drawing Sheets

METHOD AND APPARATUS FOR INTEGRATING FLASH EPROM AND SRAM CELLS ON A COMMON SUBSTRATE

FIELD OF THE INVENTION

The present invention generally relates to the field of semiconductor memory structures. More particularly, the present invention relates to a method for integrating a nonvolatile erasable programmable read-only flash memory (flash EPROM) and a static random access memory (SRAM) on a common substrate.

BACKGROUND OF THE INVENTION

Figure 1:
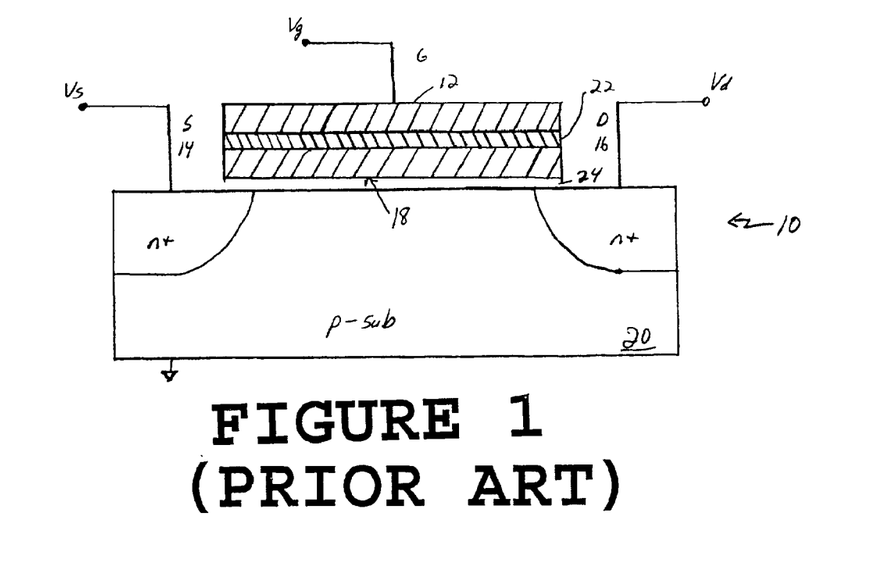
FIG. 1 illustrates a prior art conventional flash EPROM cell.

Flash EPROMS are non-volatile electrically erasable integrated circuit memory devices. Flash EPROMS utilize hot-electron injection for programming and Fowler-Nordheim tunnelling for erase. A cross-section of a conventional flash EPROM is illustrated in FIG. 1. The flash memory cell 10 is typically fabricated in a substrate 20 of p-type silicon with a source region 14 optimized for the erase condition and a drain region 16 optimized for hotelectron programming. The flash memory cell 10 also includes a floating gate 18 and a control gate 12, separated by a thin dielectric 22.

In flash EPROMS, the floating gate 18 is typically programmed by channel hotelectron injection, and erased by Fowler-Nordheim tunnelling. Capacitive coupling, in these stacked gate structures, to the control gate 12, creates the field across the floating gate 18 necessary to accumulate the electrons. In order to maximize the capacitive coupling between the control gate 12 and the floating gate 18, the dielectric 22 separating the two is fabricated with as thin a layer as is possible, and from a material having a high dielectric constant. It is known in the prior art to pattern polysilicon to form the floating gate 18. The dielectric 22 is then formed by creating an insulation film on the floating gate 18. This insulation film is typically created by thermally growing silicon oxide, depositing silicon nitride, and then re-oxidizing the silicon nitride to create an oxidized-nitride-oxide (ONO) layer. Because the control gate 12 and the floating gate 18 are typically patterned from polysilicon, this dielectric layer 22 is often referred to as the inter-poly dielectric. Similarly, a thin dielectric layer 24 referred to as tunnel oxide, exists between the floating gate 18 and the substrate 20.

Figure 2:
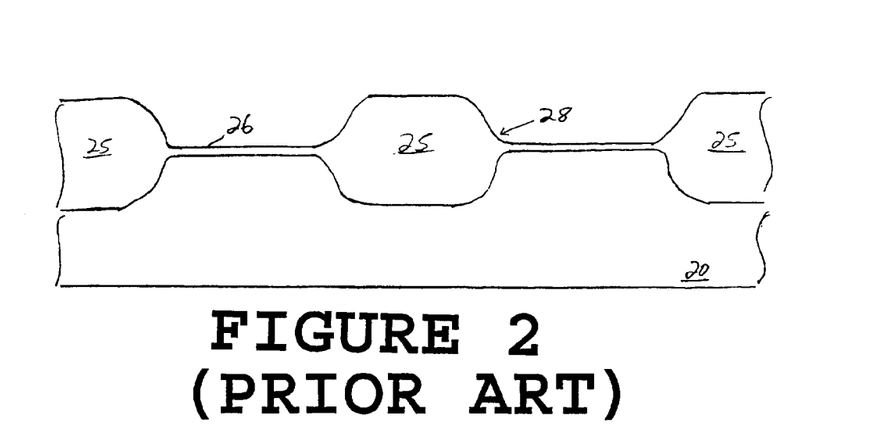
FIG. 2 illustrates a prior art conventional local oxidation of silicon (LOCOS) isolation technique.

Generally, local oxidation of silicon (LOCOS) isolation techniques are used during the fabrication of flash EPROM memory cells. The LOCOS isolation technique is optimal for the isolation of flash EPROM cells due to its high reliability and the high internal voltage levels required by flash EPROM cells. FIG. 2 illustrates a cross section of the substrate 20 after a LOCOS isolation step is performed. During this LOCOS isolation step, field oxide regions 25 are formed in the substrate 20, separated by a thin layer of sacrificial oxide 26. The active regions are established by a subsequent ion implantation step through the sacrificial oxide 26 and are used to establish the threshold voltage of the cell. The isolation process is designed to achieve an acceptable field threshold voltage to route high voltages in the periphery, and field oxide thickness that gives rise to high coupling coefficients.

One major limitation of LOCOS isolation techniques is the problem of active area encroachment which occurs during the growth of the field oxide regions 25. As shown in FIG. 2, during the period of exposure to the oxidizing ambient, areas of the field oxide regions 25 encroach along the edges, thereby forming a bird's beak shaped transition region 28 of $SiO_2$ around the edges of the field oxide regions 25. This area is not flat and, accordingly, cannot be used effectively for active devices or isolation. Accordingly, the size of useable regions on the substrate 20 is decreased by the LOCOS isolation process. Furthermore, the LOCOS isolation technique requires a larger amount of space for device packing compared to other isolation techniques.

Present static random access memory (SRAM) devices typically use shallow trench isolation (STI) techniques. This is due to the fact that SRAMs do not require voltage levels as high and endurance requirements as stringent as flash EPROM devices. STI techniques have a drawback of not being compatible with higher voltages and endurance requirements. However, the STI technique is optimal for the isolation of SRAM cells because it eliminates planarity concerns and multidimensional oxidation effects, such as the bird's beak formed by the LOCOS isolation techniques, thereby allowing smaller dimensional scaling.

Figure 3:
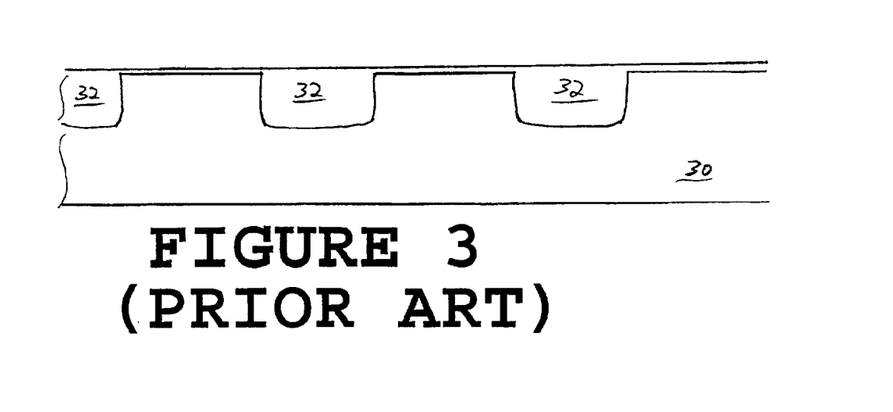
FIG. 3 illustrates a prior art conventional shallow trench isolation technique.

FIG. 3 illustrates a cross section of a substrate 30 after a STI step is performed. The STI technique uses trenches 32 etched into the surface of the substrate 30 at the isolation locations, which are subsequently filled with a thermal or deposited oxide. Such trench isolation can provide isolation oxides which extend into the substrate with little or no encroachment.

Flash EPROM and SRAM devices are currently being implemented together within systems and devices. When implemented together, because of the different isolation needs described above, the SRAM device and the flash EPROM are typically manufactured as separate components and then stacked or piggybacked within a package or the system. If the SRAM device and the flash EPROM are implemented separately and piggybacked, then signals sent between the SRAM device and the flash EPROM must exit the originating device and enter the receiving device, leading to possible signal delays. Stacking flash EPROM and SRAM devices within a package may also cause package reliability problems.

Accordingly, what is needed is a method for integrating SRAM and flash EPROM cells within a single device.

SUMMARY OF THE INVENTION

A system for and a method of integrating SRAM cells and flash EPROM cells onto a single silicon substrate includes an area on the silicon substrate where a local oxidation of silicon (LOCOS) isolation technique is implemented and another area on the same silicon substrate where a shallow trench isolation (STI) technique is implemented. Further, this system and method also include flash EPROM cells implemented within the area of the substrate utilizing the LOCOS isolation technique and SRAM cells implemented within the area of the substrate utilizing the STI technique. Preferably, the LOCOS isolation technique is first implemented to define a flash area of the silicon substrate on which the flash EPROM cell is implemented. Before the LOCOS isolation technique is implemented, an SRAM area is masked. After the LOCOS isolation technique has been fully implemented, the flash area is then preferably masked and the STI technique is implemented in order to define the SRAM area of the silicon substrate on which the SRAM cell is implemented. After the STI technique is implemented, the flash EPROM and the SRAM cells are preferably formed. Thus, the SRAM cells and the flash EPROM cells are both implemented on the common silicon substrate, but yet are appropriately isolated from each other, as well as from other additional devices which may be further implemented on the same silicon substrate, while providing the advantages of respective isolation schemes for the two cells.

DETAILED DESCRIPTION OF THE PREFERRED EMBODIMENT

A system for and a method of integrating SRAM and flash EPROM cells on a common silicon substrate using appropriate isolation techniques allows the present invention to reduce the package size, increase durability and reliability of the semiconductor device and increase communication speed and accuracy between the SRAM and flash EPROM cells. The present invention allows the STI process and the LOCOS process to be implemented on the same silicon substrate. The STI process is optimized for utilization with the SRAM cells. The STI process allows a greater density of cells to be implemented within an area of the silicon substrate than does the LOCOS process. The LOCOS process is optimized for utilization with the flash EPROM cells. The LOCOS process is capable of effectively isolating areas in which larger voltages are utilized than the STI process. By implementing the STI process in locations on the common silicon substrate where the SRAM cells are utilized and by implementing the LOCOS process in locations on the common silicon substrate where the flash EPROM cells are utilized, both the SRAM and the flash EPROM cells are each optimally configured on the same silicon substrate.

The present invention maximizes cell density and protection of the cells on the silicon substrate by utilizing a combination of the STI process and the LOCOS isolation process on the same silicon substrate. Further, by utilizing both the SRAM cells and the flash EPROM cells on the common silicon substrate, the present invention is capable of transmitting data between the SRAM cells and the flash EPROM cells faster and more reliably than prior art devices in which the SRAM cells and the flash EPROM cells are implemented on separate devices.

Figure 4:
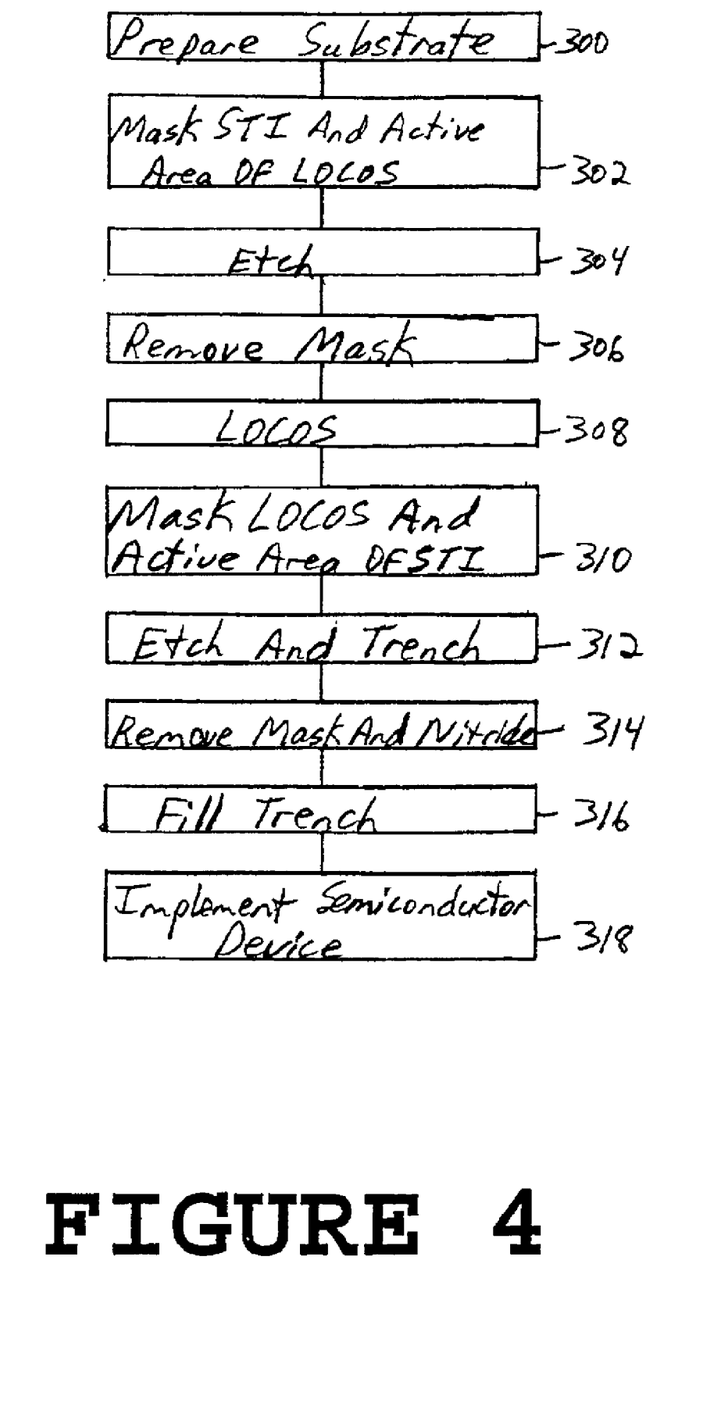
FIG. 4 illustrates a flow chart of the method of manufacturing an SRAM device and a flash EPROM device on the same silicon substrate according to the preferred embodiment of the present invention.

A flow diagram illustrating the steps within the fabrication process of the preferred embodiment of the present invention is illustrated in FIG. 4. At the step 300 the substrate is prepared by forming a layer of oxide and nitride on top of the substrate. The substrate is separated into two areas. A first SRAM area is designated for implementation of the SRAM cells. A second flash area is designated for implementation of the flash EPROM cells. Within the first area, the STI process is performed. Within the second area, the LOCOS isolation process is performed.

Before the LOCOS isolation process is performed within the second area, the first area, designated for the STI process, and an active region within the second area are masked, at the step 302. Using this mask step, the first area designated for the STI process is protected from the LOCOS isolation process. Next at the step 304, the layer of nitride is etched from the surface of the substrate in areas not protected by the mask deposited in the step 302. At the step 306, the mask covering the nitride within the second area and the mask covering the first area, are removed. At the step 308, the LOCOS isolation process is performed, forming a layer of field oxide in the substrate, separated by thin oxide regions, as described above. At the step 310, the second area designated for the LOCOS isolation process and the active regions within the first area, is masked. The second area designated for the LOCOS isolation process is protected from the STI process by this mask. Next, at the step 312, the unmasked areas within the first area, designated for the STI process, are etched to remove the layers of oxide and nitride and a shallow trench is formed within the substrate. Next, at the step 314, the mask over both the second area, designated for the LOCOS isolation process, and the active region within the first area, is then removed. At the step 316, the trenches formed within the substrate are filled. At the step 318, after both the LOCOS isolation process has been performed over the second area and the STI process has been performed over the first area, at least one SRAM cell is implemented in the first area and at least one flash EPROM cell is implemented in the second area, in any appropriate manner known to those skilled in the art. Note that several steps which are known to those skilled in the art, such as channel stop implants, etc., have not been described herein, in order to highlight the major process steps within the method of the present invention and the differences between the present invention and the prior art.

The method of the present invention preferably performs the LOCOS isolation process first on a portion of the common silicon substrate while protecting other areas of the silicon substrate, designated for the STI process. After the LOCOS process is completed, the STI process is preferably performed on a different portion of the common silicon substrate while protecting other areas of the silicon substrate, designated for the LOCOS isolation process. After the STI process is completed, the present invention then implements the SRAM and the flash EPROM cells within areas of the common silicon substrate utilizing the STI process and the LOCOS isolation process, respectively. In a first alternate embodiment, the STI process is performed before the LOCOS isolation process. In a second alternate embodiment, the implementation of the SRAM cells and the flash EPROM cells occur after completion of each of the STI process and the LOCOS isolation process, respectively.

Figure 5:
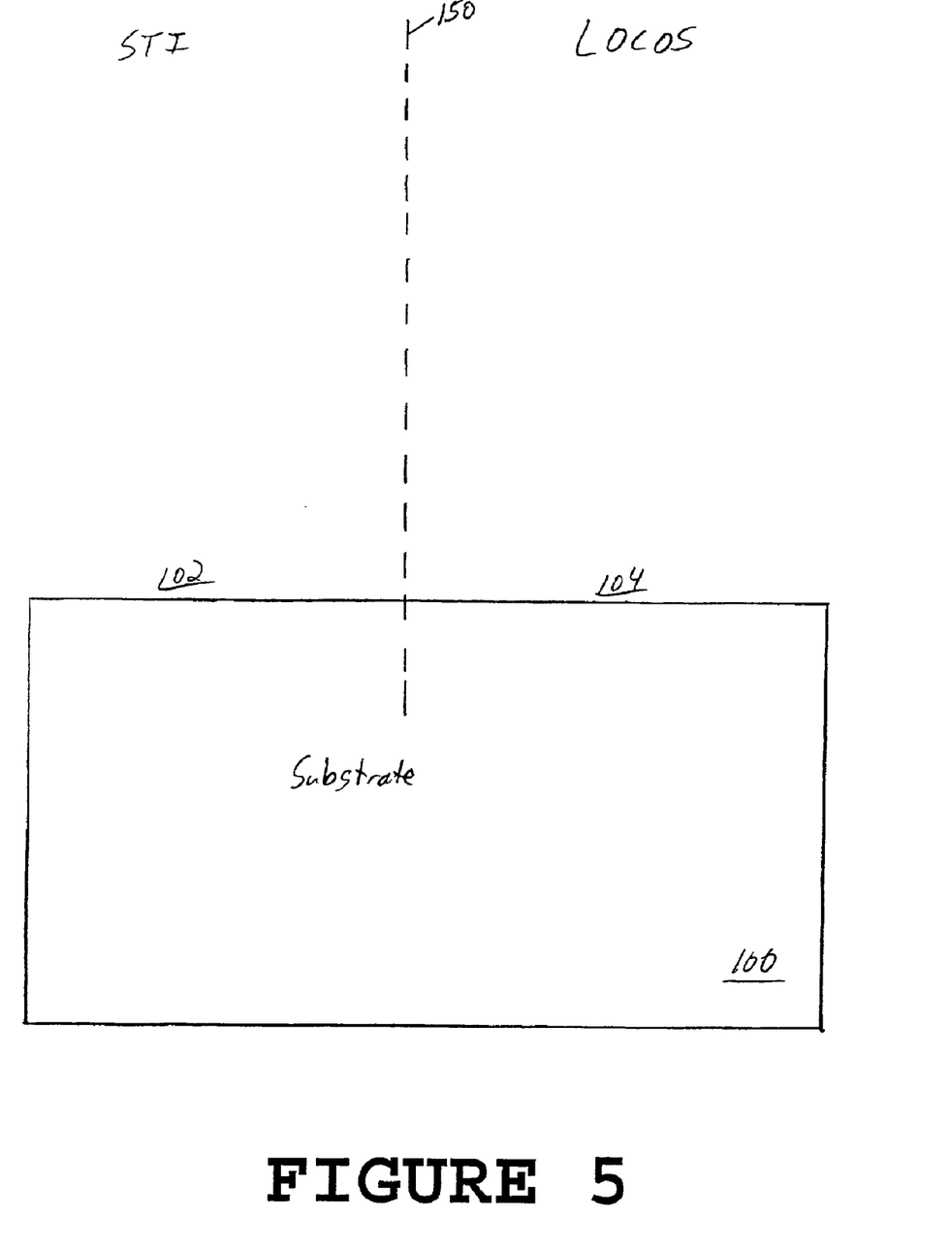
FIG. 5 illustrates a substrate having a first STI area and a second LOCOS area on which the SRAM cells and the flash EPROM cells are formed, respectively.
Figure 6:
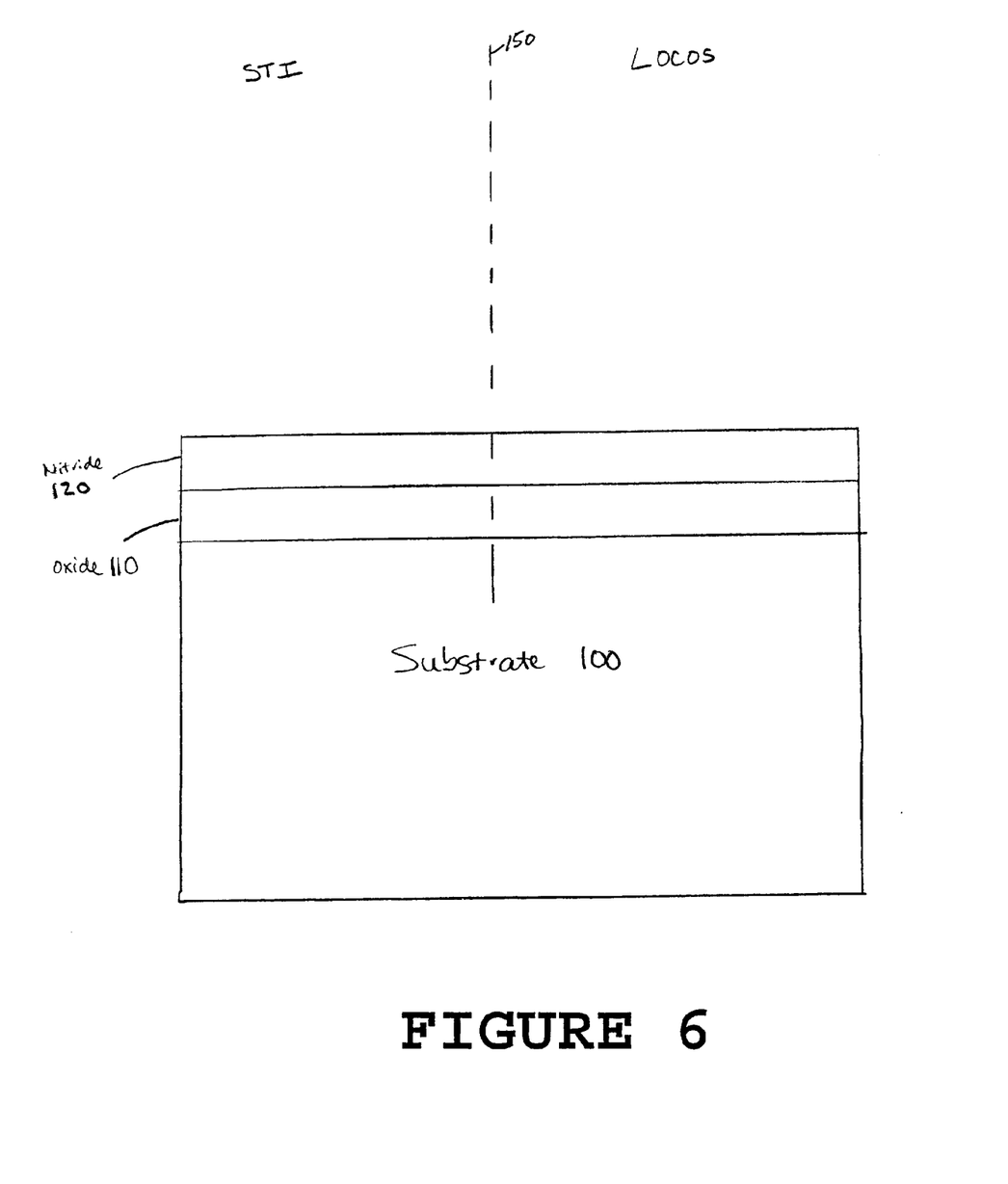
FIG. 6 illustrates a step of preparing a substrate as a part of the method of manufacturing according to the present invention.

FIGS. 5–14 illustrate cross sectional views of the various steps in the process of the preferred embodiment of the present invention, as set forth in FIG. 4. The process begins on a substrate, as illustrated in FIG. 5. The substrate 100 includes a first area 102, designated for the STI process, and a second area 104, designated for the LOCOS isolation process. The SRAM devices are preferably implemented in this first area 102 after the STI process has been performed. Within the FIGS. 5–14, the first area 102 and the second area 104 are shown separated by the vertical dashed line 150. It should be understood that the vertical dashed line 150 is provided for clarity in the illustration of the apparatus and method of the present invention, but in practice, the substrate 100 is a single uniform substrate. The flash EPROM devices are preferably implemented in the second area 104 after the LOCOS isolation process has been performed. The substrate 100 is prepared to accept both the STI and LOCOS isolation techniques by depositing an oxide layer 110 and a nitride layer 120, over the substrate 100, as illustrated in FIG. 6. The nitride layer 120 preferably protects the underlying substrate 100 and the layer of oxide 110 from steps performed for the STI process and the LOCOS process. More specifically, the areas covered by the layer of nitride 120 will not react and will not oxidize during the steps of the STI process and the LOCOS process. The oxide layer 110 functions as a sacrificial layer and is preferably utilized as a base surface on which to grow oxide fields.

Figure 7:
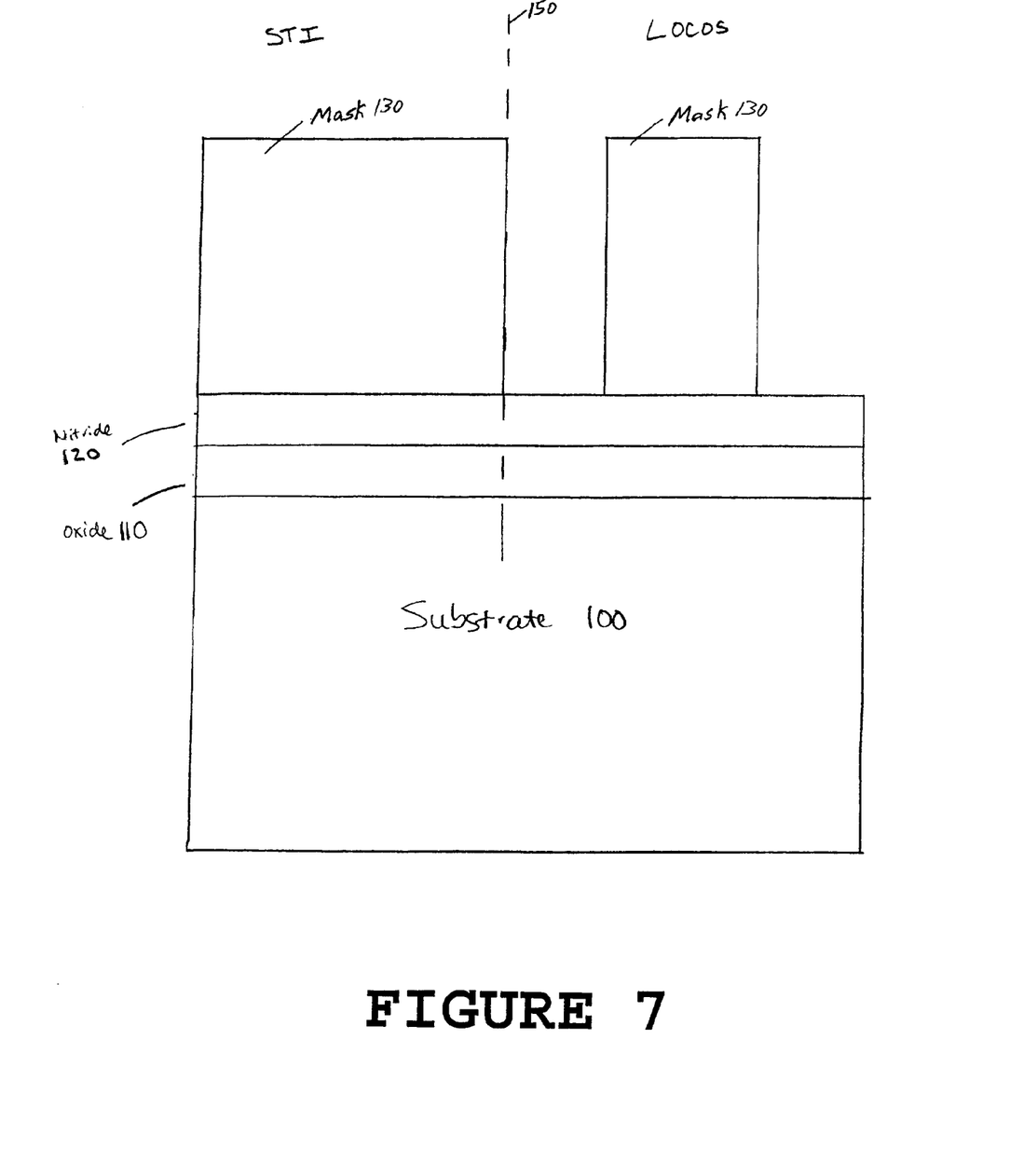
FIG. 7 illustrates a step of masking the STI region and a portion of the LOCOS region as a part of the method of manufacturing according to the present invention.

In the preferred embodiment, the LOCOS isolation process is implemented on the substrate 100 before the STI process. Before the LOCOS isolation process is performed, a mask 130 is formed over the first area 102, designated for the STI process, and an active region within the second area 104, as illustrated in FIG. 7. The mask 130 is preferably formed from a photoresist.

Figure 8:
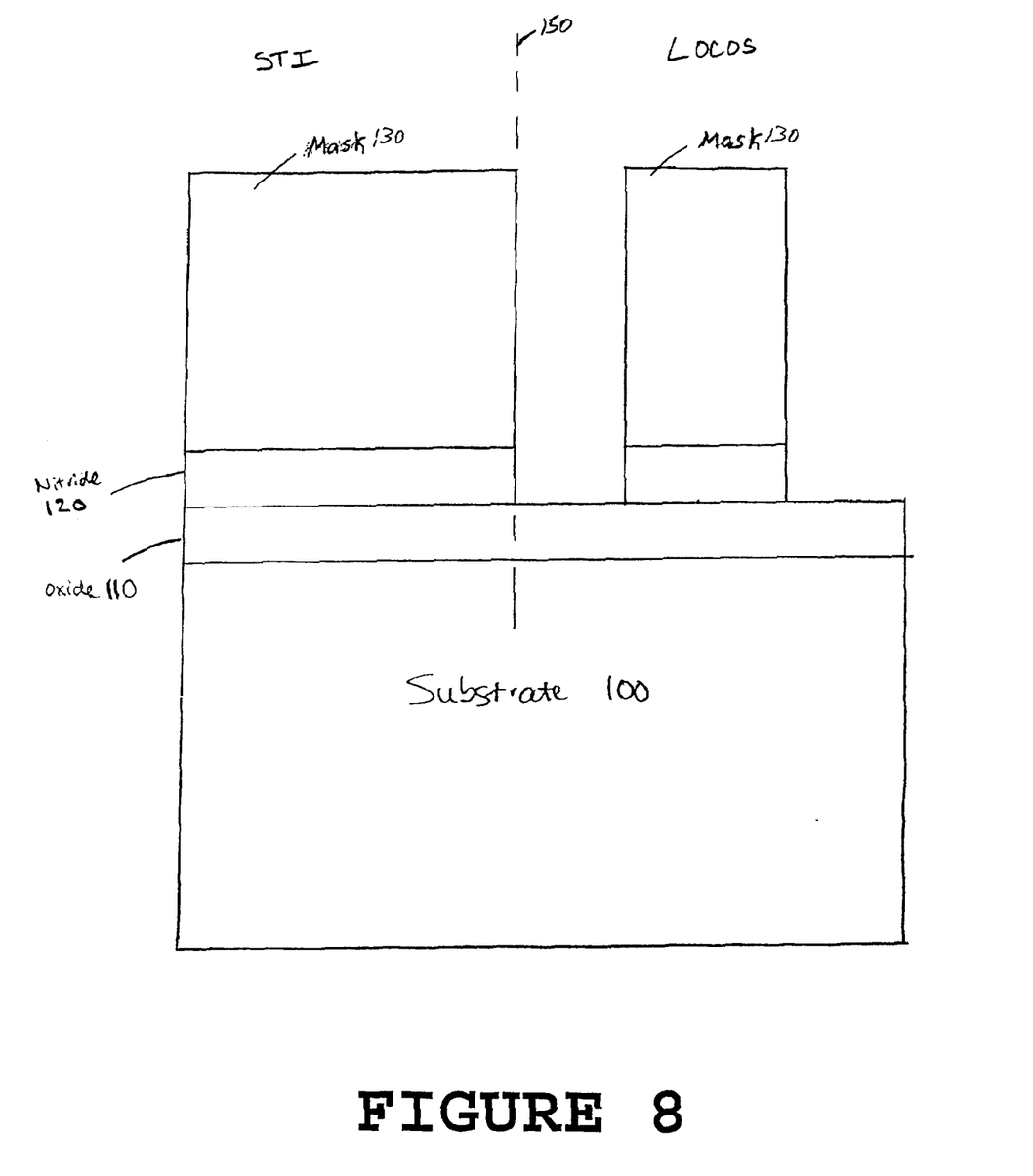
FIG. 8 illustrates a step of etching exposed portions of the LOCOS region as a part of the method of manufacturing according to the present invention.
Figure 9:
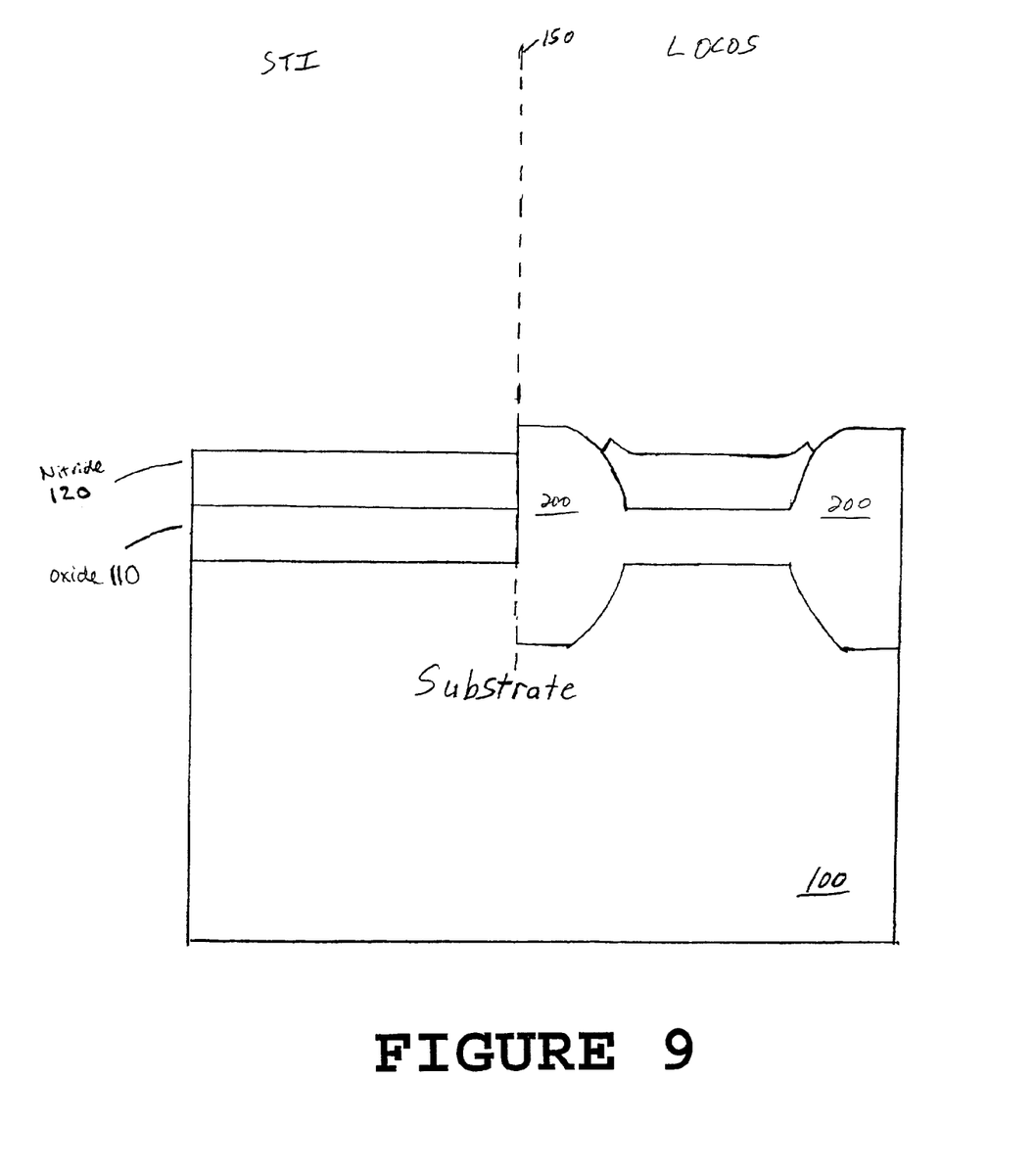
FIG. 9 illustrates a step of growing an oxide field as a part of the method of manufacturing according to the present invention.

As shown in FIG. 8, the layer of nitride 120 is preferably etched away in areas not covered by the mask 130. The mask 130, covering the first area and the active area within the second area, is then removed. Next, as shown in FIG. 9, the LOCOS isolation process is performed over the unmasked portions, forming field oxide layers 200. The field oxide layers 200 are preferably between 4000 and 6500 angstroms in thickness in order to appropriately isolate connection lines and memory cells.

Figure 10:
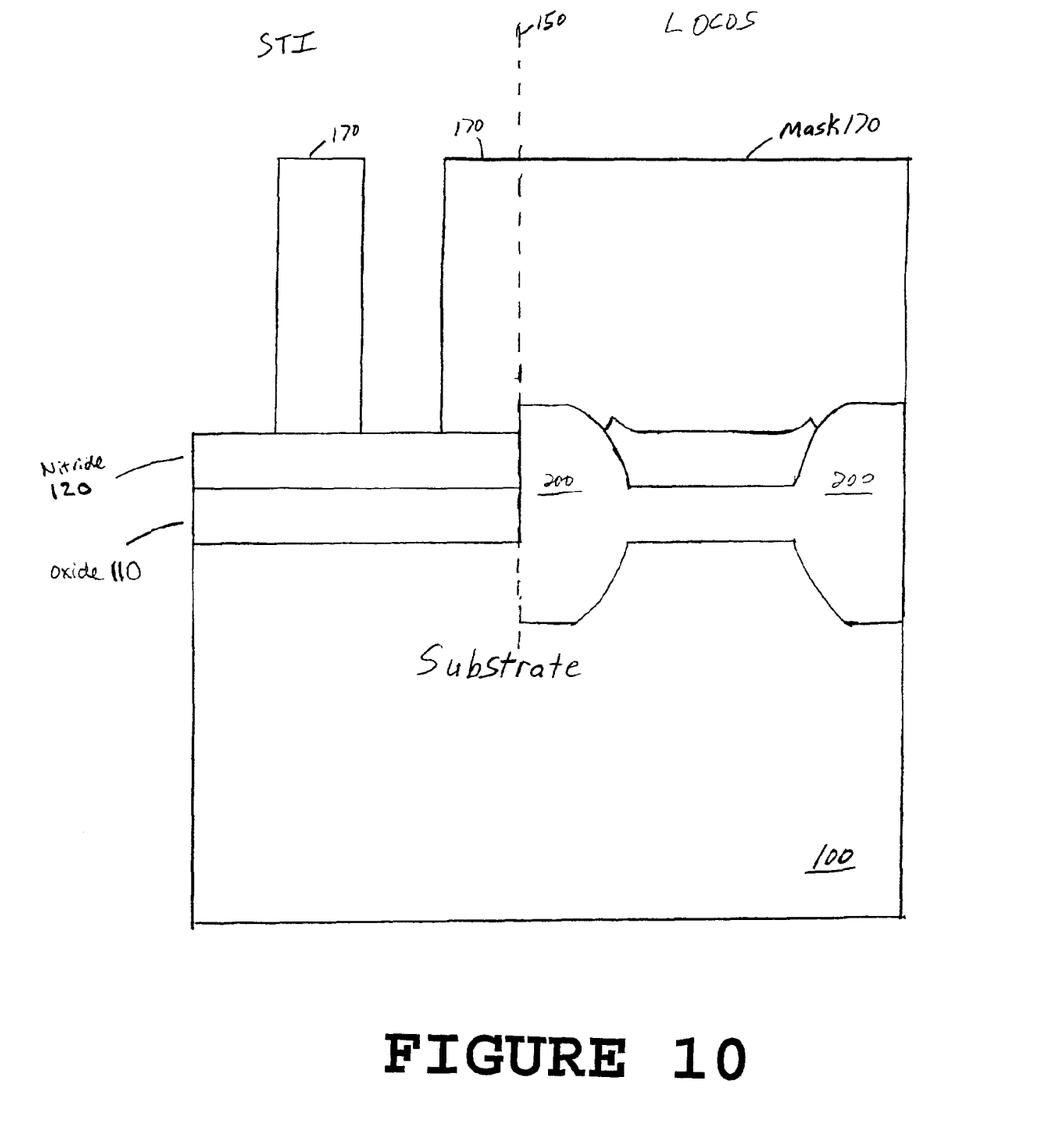
FIG. 10 illustrates a step of masking the LOCOS region and a portion of the STI region as a part of the method of manufacturing according to the present invention.

Preferably after the LOCOS isolation process is completed, the STI process commences by forming a mask 170 over the second area 104 and an active region within the first area 102, as illustrated in FIG. 10. The mask 170 is preferably formed from a photoresist. The mask 170 protects the second area 104 and the active region within the first area 102 from any of the steps involved in the STI process.

Figure 11:
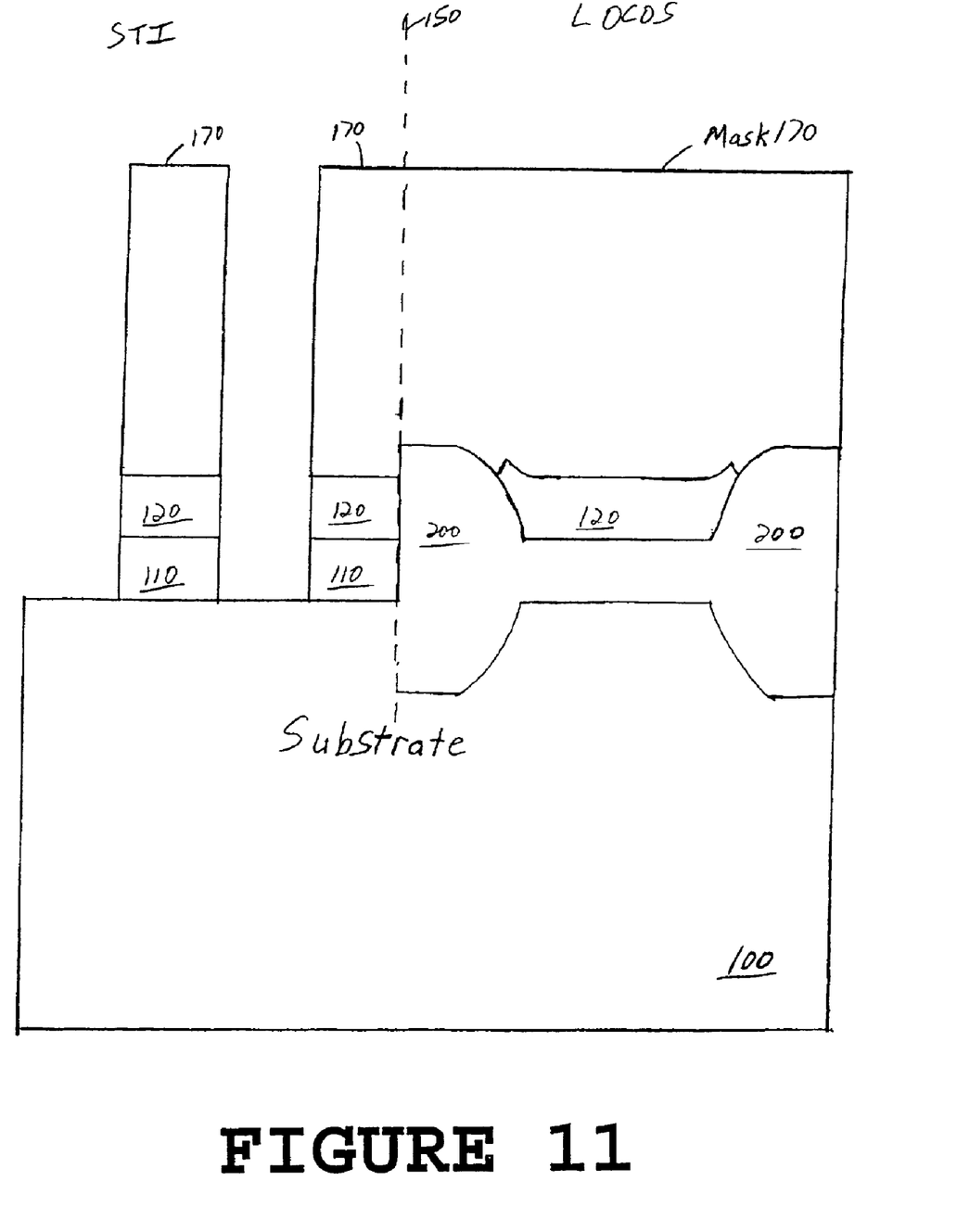
FIG. 11 illustrates a step of etching exposed portions of the STI region as a part of the method of manufacturing according to the present invention.
Figure 12:
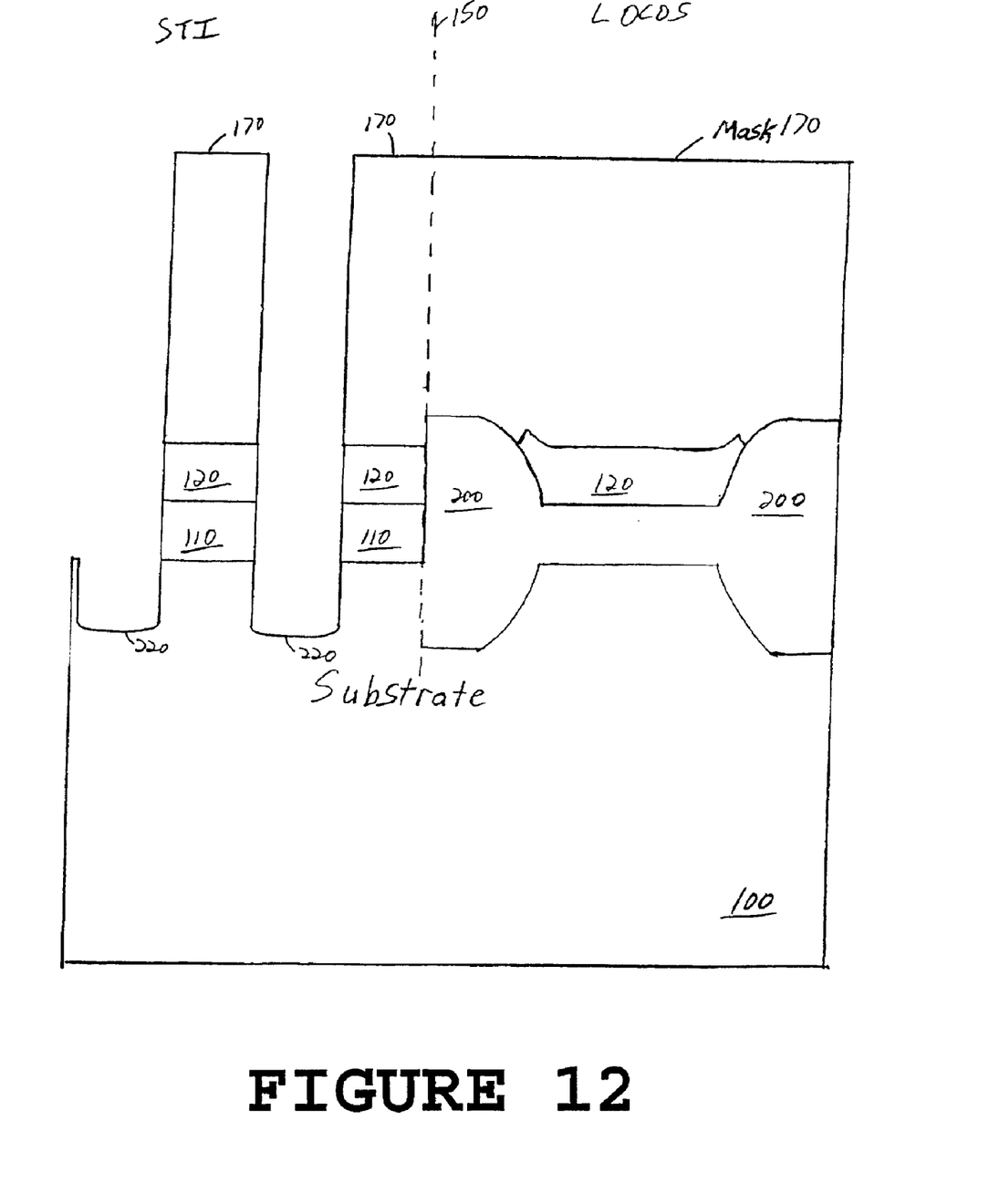
FIG. 12 illustrates a step of forming shallow trenches within exposed portions of the STI region as a part of the method of manufacturing according to the present invention.
Figure 13:
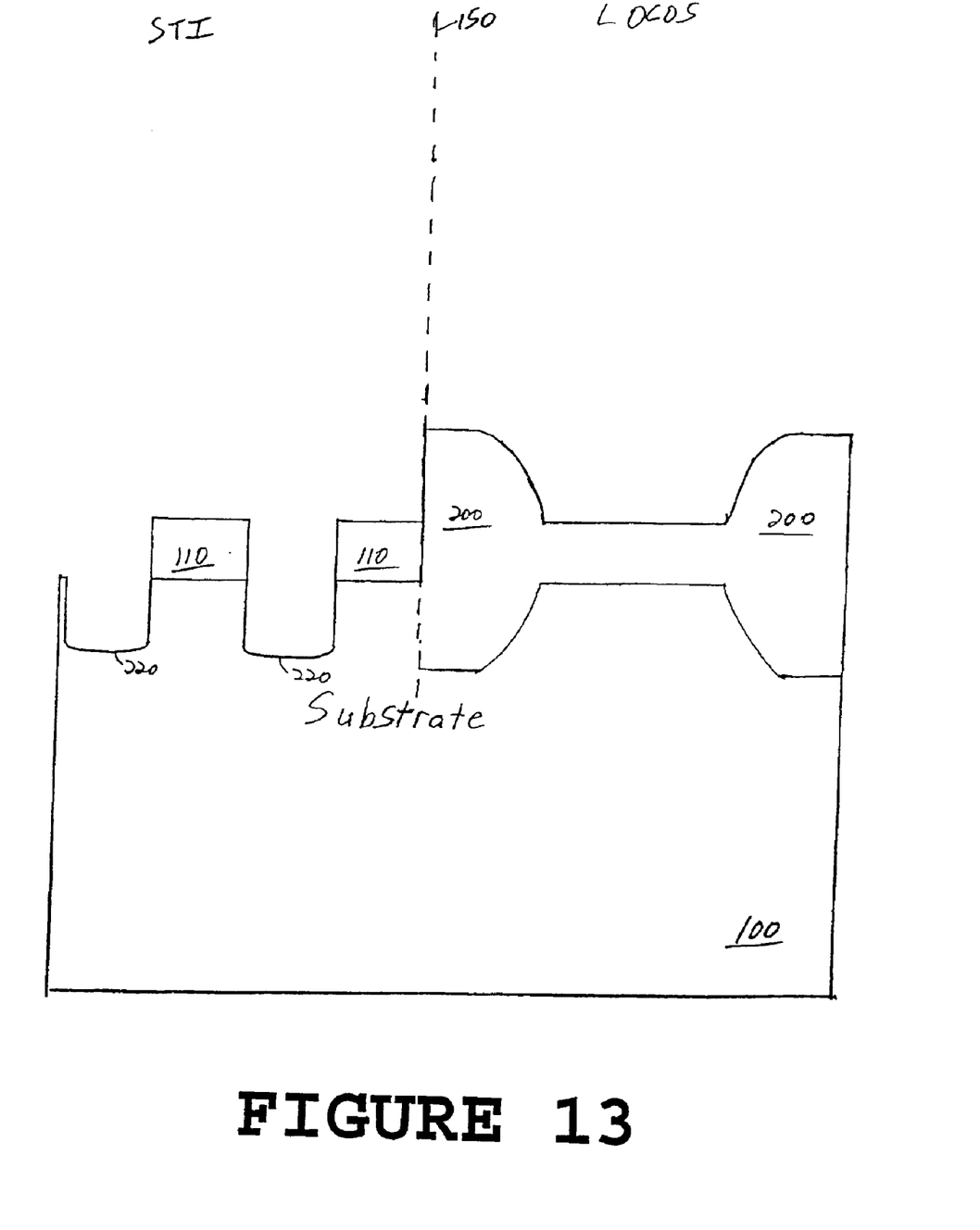
FIG. 13 illustrates a step of removing the mask and nitride layer as a part of the method of manufacturing according to the present invention.

Next, as shown in FIG. 11, the layer of nitride 120 and the layer of oxide 110 are preferably etched away in the STI areas which are not covered by the mask 170. Following the step of etching away the layer of nitride 120 and the layer of oxide 110, the exposed silicon substrate 100 is etched away to form shallow trenches 220, as shown in FIG. 12. The mask 170 and the underlying layer of nitride 120 are removed, as illustrated in FIG. 13.

Figure 14:
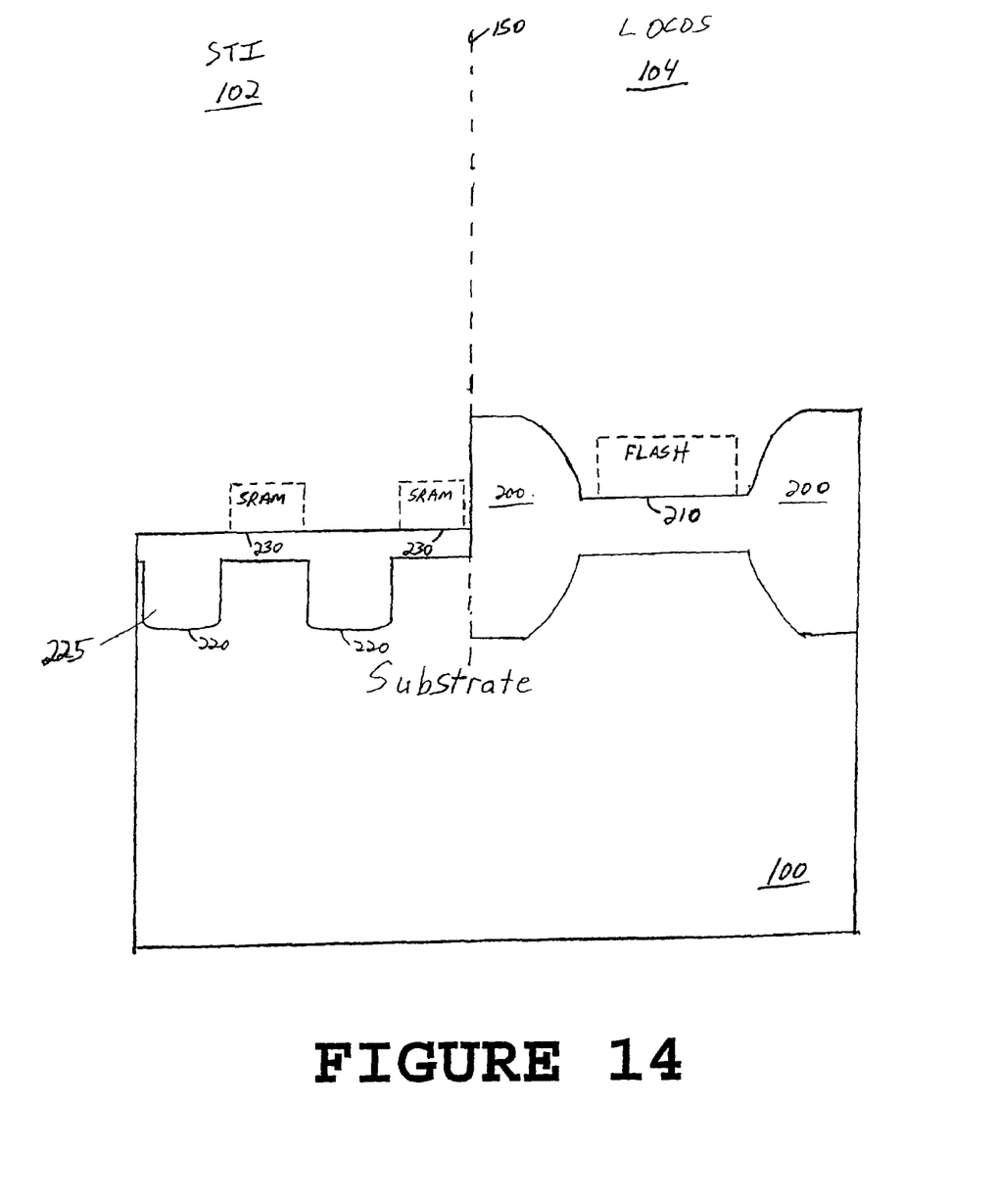
FIG. 14 illustrates a step of filling the shallow trenches as a part of the method of manufacturing according to the present invention.

The shallow trenches 220 are then preferably filled with an insulating oxide substance 225 and a blanket etch is performed, as shown in FIG. 14, to expose the active regions 210 and 230. The insulating oxide substance 225 provides an insulating property which electrically isolates the area 220 on the substrate 100 from other areas on the substrate 100. The active region 210 corresponds to the location for implementing semiconductor devices, preferably flash EPROM devices, which are isolated by the LOCOS process. The active region 230 corresponds to the location for implementing semiconductor devices, preferably SRAM devices, which are isolated by the STI process.

Preferably, SRAM cells are then implemented within the active regions 230 of the first area in any appropriate manner known to those skilled in the art. Similarly, flash EPROM cells are preferably implemented within the active regions 210 of the second area in any appropriate manner known to those skilled in the art.

In the preferred embodiment of the present invention, the LOCOS isolation process is implemented on the silicon substrate before the STI process. Further, both the STI process and the LOCOS isolation process are completed on the silicon substrate prior to implementation of either the SRAM cells or the flash EPROM cells on the silicon substrate. In a first alternate embodiment, the STI process is implemented on the silicon substrate prior to the LOCOS isolation process. In a second alternate embodiment, the corresponding semiconductor devices are implemented immediately after each of the respective isolation techniques are implemented on the silicon substrate. For example, in the second alternate embodiment, the SRAM cells are implemented on the silicon substrate after the STI process is implemented and before the LOCOS isolation process is implemented. The STI process and the LOCOS isolation process are utilized in the preferred embodiment of the present invention and correspond with the SRAM and flash EPROM cells, respectively. However, as should be apparent to those skilled in the art, various different isolation techniques along with a variety of different semiconductor devices are capable of being utilized.

The present invention integrates SRAM and flash EPROM cells on a common silicon substrate using different isolation techniques for the SRAM and flash EPROM cells. By utilizing the STI isolation technique for the SRAM cells and the LOCOS isolation technique for the flash EPROM cells on the common silicon substrate, the present invention combines the SRAM and flash EPROM cells on the same substrate, using the respective optimal isolation techniques. By utilizing the optimal isolation technique for each type of cell on the common substrate, the package size of the substrate is minimized and the reliability of the cells within the substrate is increased. In addition, by implementing both the SRAM and flash EPROM cells on a common silicon substrate, there is less interference and quicker transmission of data between the SRAM and flash EPROM cells, compared to prior art devices in which the SRAM cells and the flash EPROM cells are implemented on separate devices.

The present invention has been described in terms of specific embodiments incorporating details to facilitate the understanding of principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

I claim:

1. A semiconductor device comprising:
   a common substrate;
   an SRAM device implemented on the common substrate and isolated by an STI isolation structure; and
   a flash EPROM device implemented on the common substrate and isolated by a LOCOS isolation structure, wherein the STI isolation structure and the LOCOS isolation structure are implemented non-concurrently.

2. The semiconductor device according to claim 1 wherein the SRAM device is coupled to the flash EPROM device for transmitting signals between the SRAM device and the flash EPROM device.

3. A system containing different types of isolation structures, the system comprising:
   a common substrate having a first portion including an STI isolation structure and a second portion including a LOCOS isolation structure, wherein the STI isolation structure and the LOCOS isolation structure are implemented non-concurrently;
   an SRAM device on the first portion of the substrate; and
   a flash EPROM device on the second portion of the substrate.

4. The system according to claim 3 wherein the SRAM device is coupled to the flash EPROM device for transmitting signals between the SRAM device and the flash EPROM device.

5. A semiconductor device comprising:
   a common substrate having a first portion including an STI isolation structure and a second portion including a LOCOS isolation structure, wherein the STI isolation structure and the LOCOS isolation structure are implemented non-concurrently;
   an SRAM device implemented on the first portion of the substrate; and
   a flash EPROM device implemented on the second portion of the substrate.

6. The semiconductor device according to claim 5 wherein the SRAM device is coupled to the flash EPROM device for transmitting signals between the SRAM device and the flash EPROM device.

7. A semiconductor device, comprising:
   a common substrate;
   a first portion formed on the common substrate, the first portion comprising an SRAM device over a first single device layer, the first single device layer comprising a first active region and an STI isolation structure; and
   a second portion formed on the common substrate, the second portion comprising a flash EPROM device over a second single device layer, the second single device layer comprising a second active region and a LOCOS isolation structure.

8. The semiconductor device of claim 7, wherein the first single device layer comprises an insulating oxide.

9. The semiconductor device of claim 7, wherein the second single device layer comprises an insulating oxide.

10. A semiconductor device comprising:
    a common substrate;
    an SRAM device implemented on the common substrate and formed over a first active region on a first isolated structure including an STI isolation structure; and
    a flash EPROM device implemented on the common substrate and formed over a second active region on a second isolated structure including a LOCOS isolation structure, the second isolated structure having an outer portion extending a first depth into the substrate and an inner portion including the second active region and extending a second depth into the substrate, the first depth larger than the second depth.

11. The semiconductor device of claim 10, wherein the first isolated structure and the second isolated structure are contiguous.

12. The semiconductor device of claim 10, wherein the first isolated structure and the second isolated structure both comprise an oxide material.

13. A system containing a semiconductor device having a plurality of isolated structures, the system comprising:
    a common substrate having a first area including an STI isolation structure and a second area including a LOCOS isolation structure, the second area having an outer portion extending a first depth into the substrate and an inner portion including an active region extending a second depth into the substrate, wherein the first depth is larger than the second depth;
    an SRAM device implemented on the first area of the substrate; and
    a flash EPROM device implemented on the second area of the substrate.

14. The system of claim 13, wherein the first area and the second area are contiguous.

15. The system of claim 14, wherein the first area and the second area both comprise an oxide material.

* * * * *